(12) United States Patent
Ostrom et al.

(10) Patent No.: US 7,411,651 B2
(45) Date of Patent: Aug. 12, 2008

(54) PSM ALIGNMENT METHOD AND DEVICE

(75) Inventors: Thomas Ostrom, Stockholm (SE);
Raoul Zerne, Solna (SE)

(73) Assignee: Micronic Laser Systems AB, Taby (SE)

( * ) Notice: Subject to any disclaimer, the term of this patent is extended or adjusted under 35 U.S.C. 154(b) by 882 days.

(21) Appl. No.: 10/911,218

(22) Filed: Aug. 4, 2004

(65) Prior Publication Data

US 2005/0053273 A1    Mar. 10, 2005

Related U.S. Application Data

(60) Provisional application No. 60/546,624, filed on Feb. 20, 2004, provisional application No. 60/492,433, filed on Aug. 4, 2003.

(51) Int. Cl.
*G03B 27/42* (2006.01)
(52) U.S. Cl. .............................. 355/53; 355/67; 355/71; 378/34; 250/492.2

(58) Field of Classification Search ................... 355/53, 355/67, 71; 378/34, 35; 250/492.2
See application file for complete search history.

(56) References Cited

U.S. PATENT DOCUMENTS

| 4,734,746 | A | * | 3/1988 | Ushida et al. | ................. 355/53 |
| 4,812,661 | A | * | 3/1989 | Owen | ...................... 250/492.2 |
| 6,285,488 | B1 | * | 9/2001 | Sandstrom | .................. 355/67 |

FOREIGN PATENT DOCUMENTS

WO    WO2005013006    *    2/2005

* cited by examiner

*Primary Examiner*—Della J. Rutledge
(74) *Attorney, Agent, or Firm*—Ernest J. Beffel, Jr.; Haynes Beffel & Wolfeld, LLP (57) ABSTRACT

The present invention relates to alignment of a writing system and a workpiece. In particular, it relates to alignment to write a second layer pattern on a workpiece that has a first layer pattern, using an SLM. It extends to producing a mask or reticle, and to producing a layer of a device using the mask or reticle. Particular aspects of the present invention are described in the claims, specification and drawings.

28 Claims, 11 Drawing Sheets

PSM ALIGNMENT METHOD AND DEVICE

RELATED APPLICATIONS

This application is related to and claims the benefit of U.S. Provisional Applications No. 60/492,433, entitled ENHANCEMENT OF SLM LITHOGRAPHIC SYSTEMS, filed 4 Aug. 2003, and No. 60/546,624, entitled PSM ALIGNMENT, filed 20 Feb. 2004, which are hereby incorporated by reference.

This application is further related to another application filed the same day as this one, entitled FURTHER METHOD TO PATTERN A SUBSTRATE, by inventors including Jonathan Walford and Per Askebjer, which is hereby incorporated by reference.

BACKGROUND OF THE INVENTION

The present invention relates to alignment of a writing system and a workpiece. In particular, it relates to alignment to write a second layer pattern on a workpiece that has a first layer pattern, using an SLM. It extends to producing a mask or reticle, and to producing a layer of a device using the mask or reticle.

A variety of lithographic techniques have been developed that use a mask or reticle that has been patterned twice. The second patterning produces a phase shift structure.

It is increasingly important that the second patterning of the mask or reticle be accurately aligned to the first. This is particularly important with alternating phase shift structures, which may be produced in more than two patterning steps.

An opportunity arises to improve on alignment. Better alignment produces better masks or reticles or better device structures on substrates. Better masks or reticles are used to produce better layers of devices.

SUMMARY OF THE INVENTION

The present invention relates to alignment of a writing system and a workpiece. In particular, it relates to alignment to write a second layer pattern on a workpiece that has a first layer pattern, using an SLM. It extends to producing a mask or reticle, and to producing a layer of a device using the mask or reticle. Particular aspects of the present invention are described in the claims, specification and drawings.

BRIEF DESCRIPTION OF THE DRAWINGS

An alignment system is schematically depicted in FIG. 1.

The simulation setup appears in FIG. 14, which depicts a 50 nm resist dip over the etched pattern.

The simulation in FIG. 15 shows the expected reflectance difference between quartz and black chrome at NA 0.82.

Correlation of measured reflectance to simulated ones is shown in FIG. 20.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

One of the sub-functions in the Micronic Sigma 7300 mask writer is the second layer alignment system for writing of phase shift masks. The strategy chosen for performing PSM alignment is to use the DUV writing laser together with the spatial light modulator (SLM) to create a light stamp image, which is reflected on the first layer alignment marks. The reflected image is captured and measured with a DUV-sensitive CCD camera. Using the writing laser avoids position offsets coming from misalignment of multiple laser sources.

The anti-reflection (AR) function in chemically amplified resists (CAR), the bottom anti-reflex coatings (BARC) and the top anti-reflex coatings (TARC) all reduce reflectance for 248 nm incoming light. This could reduce the signal strength and accuracy of the alignment system as the 248 nm laser is used for the alignment. While the discussion describes phenomena observed using a 248 nm source, it is expected to apply to a 193 nm source as well.

This disclosure discusses, among other things, image contrast at different resist thicknesses and image contrast when AR coatings are used. An algorithm measuring the first layer alignment mark positions is also described.

The studies of this and results of the final PSM alignment system disclose useful methods and devices.

1. Introduction

Attenuated and alternating phase shift mask (PSM) have become widely used resolution enhancement techniques to overcome shrinking k1 factors. Even more aggressive PSM techniques are being developed. A common denominator for the techniques is that the PSM is manufactured in at least two writing steps, where the mask is developed, etched and re-coated with new resist between two exposures. To expose resist twice, the mask writer must be able to align the second level exposure, so that the pattern matches the first level. The first level exposure is often made with an electron beam mask writer.

For attenuated PSM, the required layer-to-layer alignment accuracy is typically several hundreds of nm. The required pattern accuracy (resolution, CD accuracy, placement accuracy) is also very loose for the second layer and it can therefore be printed e.g. on lower-end i-line laser pattern generators (PGs). The required layer-to-layer alignment accuracy for alternating PSM is much tighter. The requirements on pattern accuracy are also tighter to avoid phase errors on the PSM. For the initial alternating PSM applications, i-line laser PGs are still commonly used. However, as the feature sizes shrink for the 90-nm, 65-nm and lower technology nodes, the pattern accuracy from i-line laser PGs will not match the requirements on the second layer of the alternating PSM or other more aggressive PSM techniques.

One alternative to the i-line laser PG for the second layer is to use the same electron beam mask writer as in the first layer, an approach that has been demonstrated by R. Plontke, L. Bettin, D. Beyer, J. Butschke, M. Irmscher, C. Koepernik, B. Leibold, A. Vix, P. Voehringer, in "Avoidance/Reduction of Charging Effects in Case of Partially Insufficient Substrate Conductivity when using ESPACER 300Z", 20th European Mask Conference on Mask Technology for Integrated Circuits and Micro-Components, GMM-FB 43, pp 233-240, 2004. If the mask writer can align the second layer correctly, this should assure a good match between the two layers patterns. The disadvantage of using an electron beam system for the second layer is the creation of charges in the relief of the first layer pattern, charges that reduce the accuracy of the electron beam. One suggested method to avoid the charging is to apply a conducting film under or on top of the second layer resist, an extra process step that could lead to increased number of defects and reduced production yield.

Another attractive alternative to the i-line laser PG is a laser PG that uses a DUV wavelength. The short wavelength together with pattern fidelity enhancement techniques give pattern accuracy that very well matches the electron beam printed first layer, as described by H. Martinsson, J. Hellgren, N. Eriksson, M. Bjuggren, T. Sandström, in "Transparent corner enhancement scheme for a DUV pattern generator", Photomask Japan 2003, Proceedings SPIE vol. 5130, pp 297-308, 2003. As optical exposure is used for the second layer, charging effects don't occur and there is no need to apply any conducting film. The second layer must still be aligned to the first layer and the DUV PG must have a very accurate alignment system. The Sigma7300 DUV PG from Micronic Laser Systems uses 248 nm wavelength and an imaging technique similar to a 248 nm lithography scanner. It provides the resolution and pattern accuracy needed to avoid phase defects between the first and second layer and it has a very accurate second layer alignment system.

The Sigma 7300 second layer alignment system uses the pattern generating spatial light modulator (SLM), see WO 99/45439 which is incorporated herein by reference,] illuminated with the writing 248 nm DUV Laser and CCD camera looking at the reflected image from the substrate containing the first layer alignment pattern. See T. Sandström, P. Askebjer, J. Sellander, R. Zerne, A. Karawajczyk, "Pattern Generation with SLM Imaging", 21st Annual BACUS Symposium on Photomask Technology, Proceedings SPIE vol. 4562, pp 38-44, 2001. Using the same laser when measuring, as during writing, avoids optical alignment differences between measuring and writing. Only small, dedicated areas on the mask are exposed and there is reduced risk of affecting the real patterns of the PSM. Since the image grabbing is fast, even with a lot of robustness increasing redundancy, the yield of the system is very high.

Figure 1:
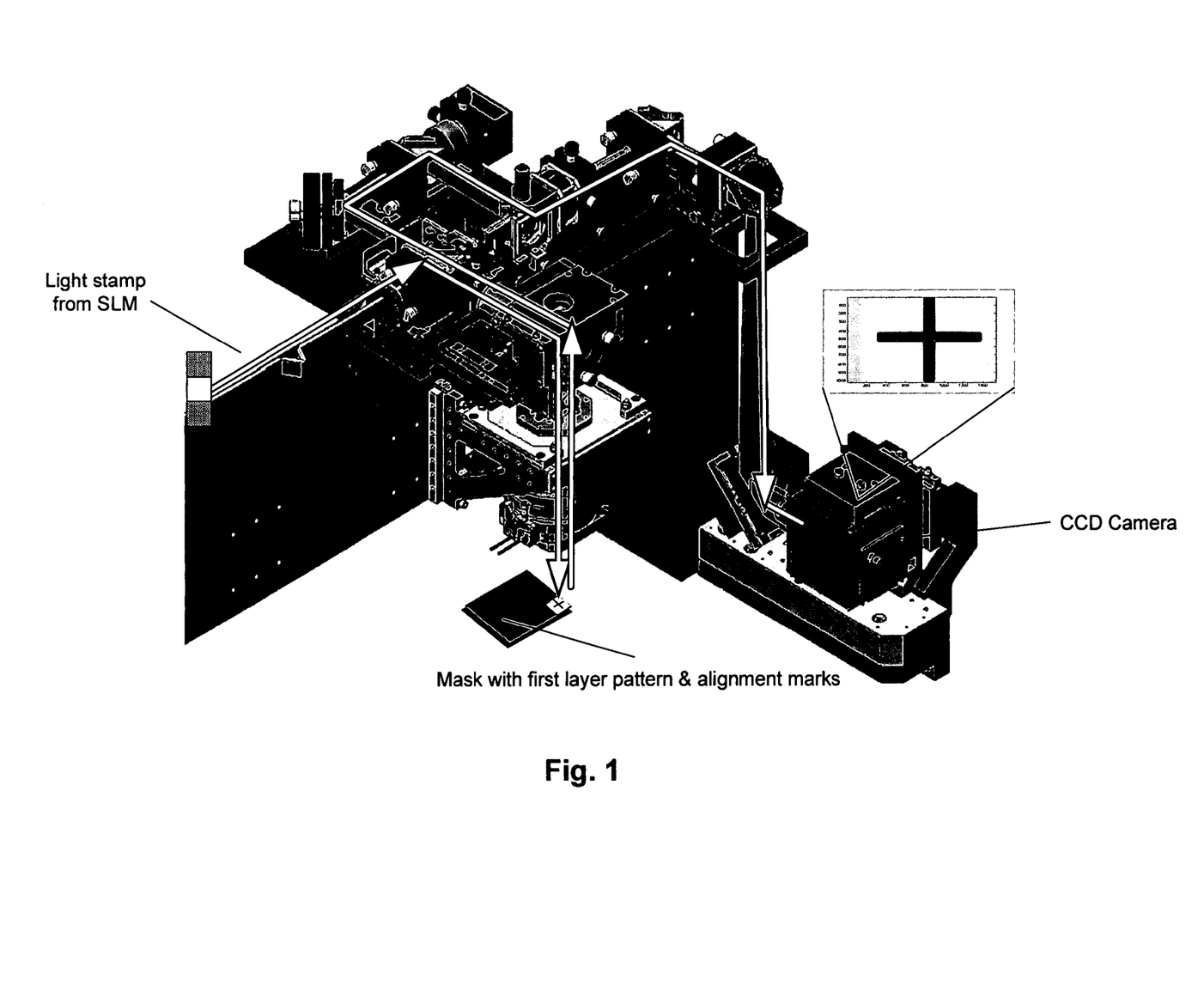

The alignment system displayed in FIG. 1, show remarkable robustness, yield and precision with total alignment time of <6 minutes and a precision of mean+3 sigma results between 13-30 nm. This paper however will not focus on the complete system performance and strategy, but merely how early concerns of the metrology technique were dealt with.

Even if the technique seemed like promising way of performing second layer alignment, some additional questions were worth addressing before starting up the full development. The first issue was how the system would respond to different resist thicknesses. Early thin film simulations of the reflectance with chemically amplified resists (CAR) on black chrome showed that one could expect to get shifting polarities in the reflected images. There was also concern that there would be resist thicknesses, giving total loss of contrast in the images during the transfer between polarities. The first study shows that this is of no concern and, together with a description of the image analysis position measurement technique, that measurement precision is excellent for all resist thicknesses.

The second issue was if AR coatings of either a 248 nm light absorbing layer would create any difficulties for the image analysis. A method how to deal with these issues, together with real tests and simulations, is disclosed below.

2. Position Measurement Strategy 2.1. Second Layer Alignment Overview

An overview of second layer alignment provides an introduction to figures that are described below. In one embodiment, the first layer alignment marks that are used contain 2 coarse align marks, 16 fine align marks and 2 reserved areas. Different numbers of marks can readily be used. The reserved areas are used for reference background normalization and CCD alignment. The coarse align strategy is improves overall performance and efficiency. The fine align marks are simple cross patterns with 2 µm line width. A pattern position in the Sigma 7300 is defined by the stage position and the pattern position on the SLM. To achieve an absolute position of the reflected first layer pattern CCD image, the coordinate system must be transferred from the SLM to the CCD. This is achieved by the CCD alignment displaying a pattern on the SLM, which is reflected on a reserved chrome area on the substrate back to the CCD. This technique makes the system practically offset free. Iterating the coarse align measurements and the fine align cross pattern measurements creates a temporary surface map transformation containing translations, scales, orthogonality and rotation which is used during the second layer printing.

Figure 2:
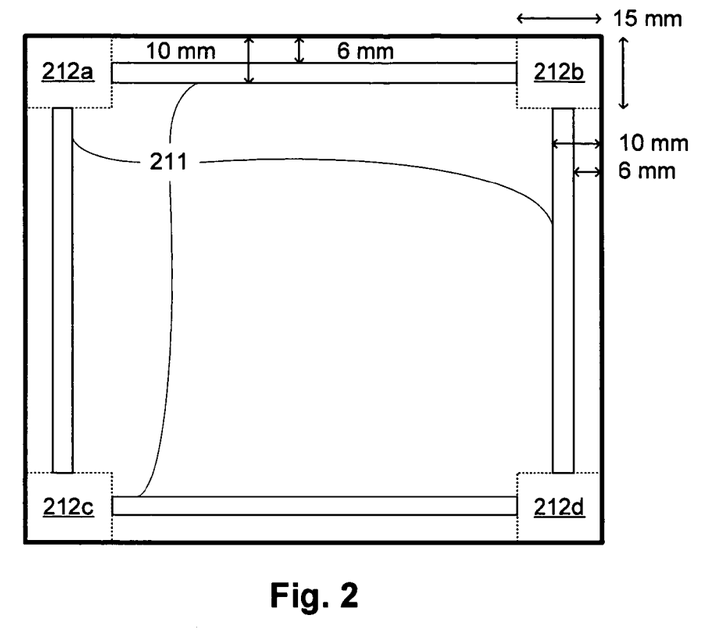
FIG. 2 illustrates one set of design rules that can be applied to second layer alignment mark positioning.

FIG. 2 illustrates one set of design rules that can be applied to second layer alignment mark positioning. One of ordinary skill will understand that areas reserved or allowed for alignment marks may be adjusted, translated, bent or changed in dimensions. Four allowed areas 211 are indicated. These areas are 4 mm wide and offset from the edge by 6 mm. They are offset from the corners 212a-212d by 15 mm. These allowed areas can accommodate rough align marks, fine align marks and blank marks. For instance, two rough align marks can be placed anywhere within allowed areas, preferably on opposite sides. The rough align marks may be 1.5 mm square, with a reserved border of 0.5 mm on each side. In addition, two blank marks, 1.5 mm square or another size, can be placed anywhere within the allowed areas. Sixteen fine align marks can be accommodated, preferably four per allowed area, with a minimum separation between marks of 1 cm and a minimum separation between first and last marks in an area of 10 cm. These marks may be 1 mm square.

Figure 3:
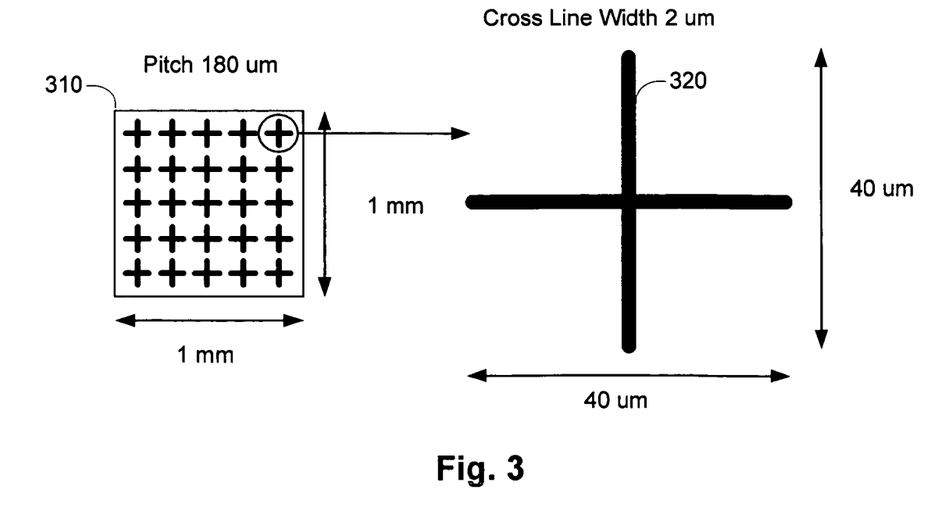
FIG. 3 depicts one detail of a fine align mark.

FIG. 3 depicts one detail of a fine align mark 310. The fine align mark includes several FIGS. 320. In alternative configurations, 16 or 25 figures can be used. For alignment, only one figure per mark need be analyzed, so other figures provide redundancy. Accordingly, other suitable numbers of figures within a mark also could be used. The figure repeated may be a cross, as depicted, or it could be a grid or other regularly spaced figure that supports calculation of translations and rotations. The cross that is depicted has 2 µm line width and 40 µm length of each cross arm.

Figure 4:
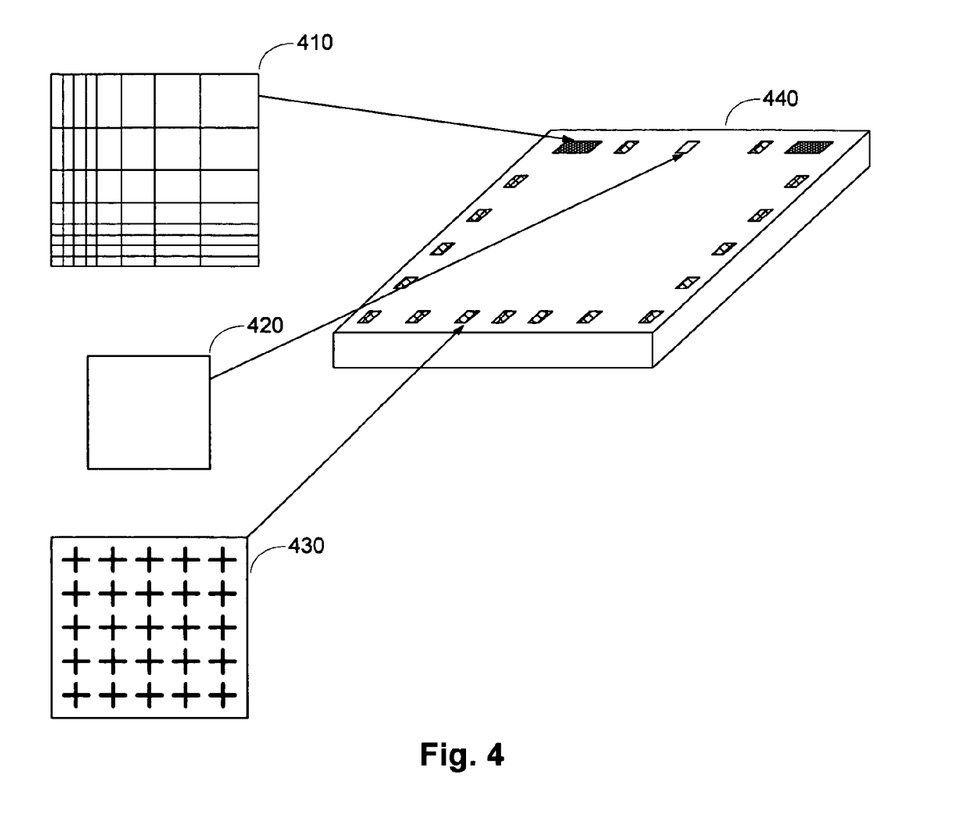
FIG. 4 depicts a sample layout of different mark types on a mask.

FIG. 4 depicts a sample layout of different mark types on a mask 440. This figure depicts two rough align marks 410, two blank marks 420 and 15 fine align marks 430. The blank marks may assist with CCD alignment. One rough align mark 410 includes of horizontal and vertical raster patterns superimposed. The lines of the raster have a constant line width, such as 1 µm. They have in increasing (or decreasing pitch, if measured in the opposite direction) starting at 3 µm and stepping by 200 nm (i.e., 3.0 µm, 3.2, 3.4 . . . 24.4 µm). As illustrated, the rough align mark includes 108 lines in each direction. Different line widths, starting pitch, step size and number of lines can be used.

One alignment sequence begins with aligning the SLM and the CCD camera. With a workpiece in place, a rough alignment is conducted using the rough alignment marks. The pattern of these marks reduces the searching required to locate the fine alignment marks positioned elsewhere in the allowed areas. The fine alignment marks are measured next, to provide data to calculate the origin, scale, ortho and rogation of the mask. With some or all of these statistics calculated, the measurement can be verified and a second mask layer written.

2.2. Image Analysis Position Measurement Algorithm

The measurement sequence is illustrated in a series of figures from FIG. 5 through FIG. 13, showing the full sequence from capturing the raw reflected image of the first layer alignment mark to the measured position.

Figure 5:
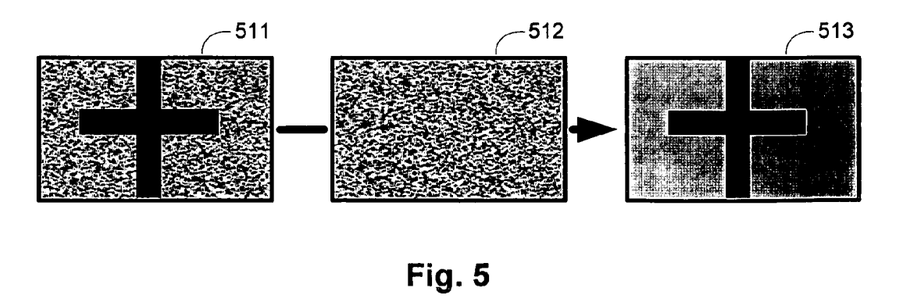
FIG. 5 illustrates how the reflected raw image is created by integrating multiple laser pulses to average out any substrate/stage movements.

FIG. 5 illustrates how the reflected raw image is created by integrating multiple laser pulses to average out any substrate/stage movements. The reflected image 511 is normalized against a reference background image 512 to extract the target figure 513.

Figure 6:
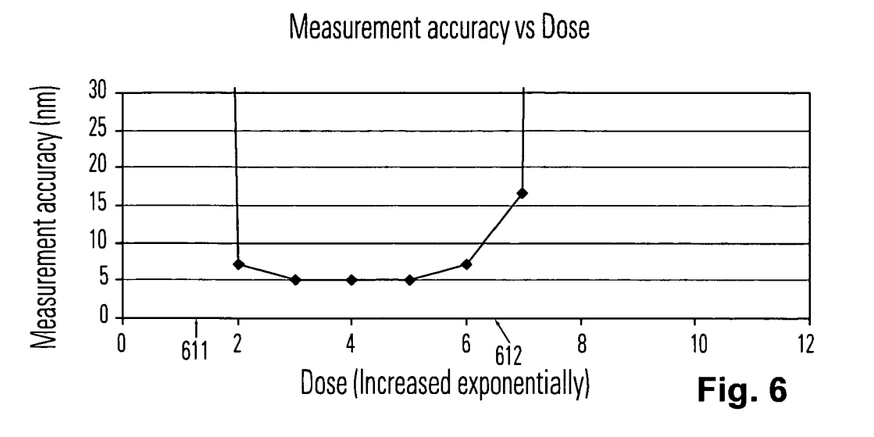
FIG. 6 reflects a study of measurement accuracy versus cumulative dose used for measurement.

FIG. 6 reflects a study of measurement accuracy versus cumulative dose used for measurement. The vertical axis is measurement accuracy. The horizontal axis is a log scale of dose. In this study, the cumulative dose was changed by increasing the number of flashes, each at ten percent of nom dose. The sequence of cumulative test flashes was 2, 5, 10, 20, 40, 80, 160 . . . . On the graph, 611 corresponds to a single pass isofocal dose. At 612, a dose of 16 times normal dose started to produce changes in the resist. In the range from a single pass isofocal dose to less than 16 times normal does, there is a wide dose range that produces a good signal and measurement accuracy, without damaging the resist.

Figure 7:
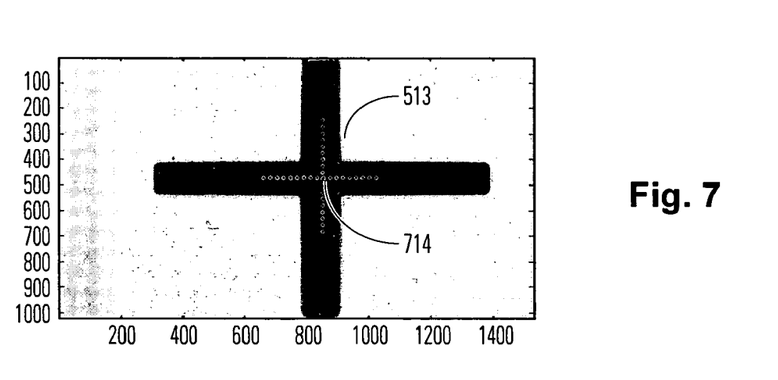
FIG. 7 depicts a pre-analysis made on a resulting image.

FIG. 7 depicts a pre-analysis made on the resulting image 513, which identifies a valid first layer alignment mark and verifies the image quality. This step also measures a rough position of the alignment mark center point 714.

Figure 8:
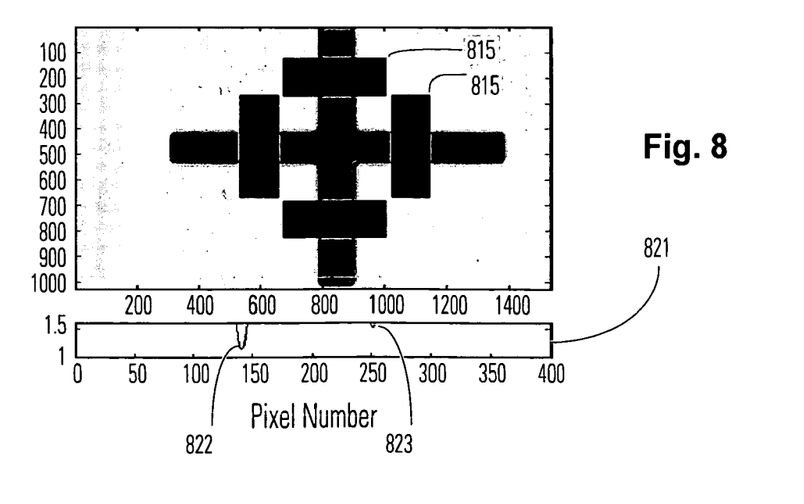
FIG. 8 shows how measurement windows are placed according to the estimated center point.
Figure 9:
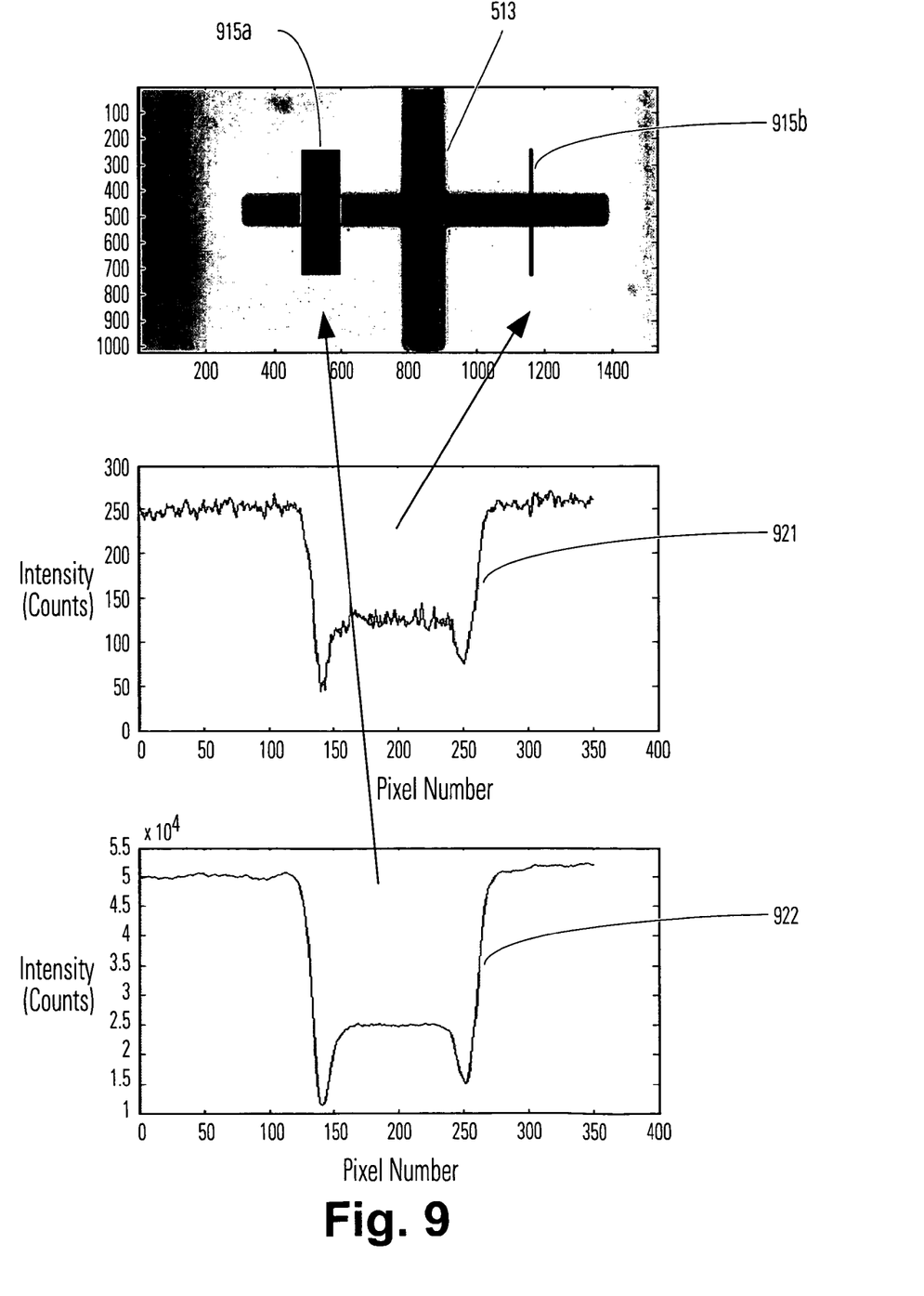
FIG. 9 depicts two measurements of arms of the target figure.

FIG. 8 shows how measurement windows 815 are placed according to the estimated center point, to addresses rotation sensitivity. For a figure with a 1 µm wide line, the center of the measurement is preferably 2 µm from the center of the figure. Multiple measurements of the same figure help address rotation of the figure. In the bottom window 821 of the figure, measurement signals 822, 823 exceeding a threshold are depicted. These measurement signals are more clearly understood from FIG. 9. In this figure, two measurements 915a-b of arms of the figure 513 are depicted. The reflected image of the figure 513 is reflected through the resist up to the CCD camera. An intensity distribution over a line of pixels perpendicular to the measurement direction gives the edge flanks of the figure arm. The number of pixels wide line that is measured impacts the resulting signal. Two signal graphs are provided, with intensity on the vertical axis and pixel number on the horizontal axis. A narrower line of pixels considered 915b produces a noisier signal 921 than a wider line of pixels 915a produces 922. Note that the signal 922 with minima at approximately 140 pixels and 250 pixels corresponds to the filtered signals 822, 823 in the window 821 of FIG. 8.

Figure 10:
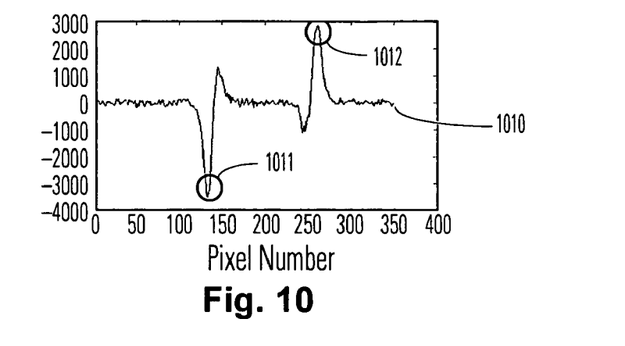
In FIG. 10, the intensity distribution is differentiated for edge detection.

In FIG. 10, the intensity distribution is differentiated 1010 for edge detection. The maximum outer edge peaks 1011, 1012 are detected, which makes the algorithm polarity independent. That is, the method applies equally well to a dark figure against a light black ground or a light figure against a dark background.

Figure 11:
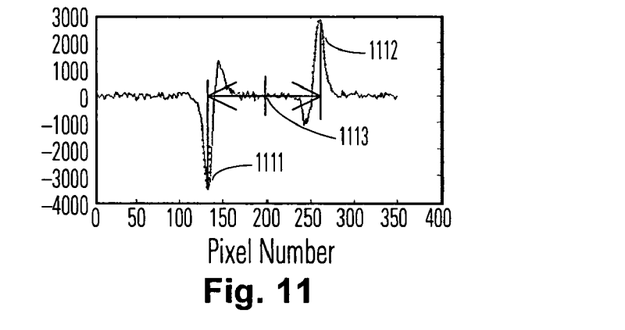
In FIG. 11, to reach sub-pixel accuracy, a second order polynomial with a predetermined number of points is fit to the derived edge peaks.

In FIG. 11, to reach sub-pixel accuracy, a second order polynomial with a predetermined number of points 1111, 1112 is fit to the derived edge peaks. A line center point 1113 is calculated between the positive and negative peaks. The mark center point can be given by creating x and y first order curve fits and calculating the cross point between them. Calculating the pattern center position like this gives an additional robustness against position errors caused by a rotated image. The preliminary center point 714 of FIG. 7 is refined.

Figure 12:
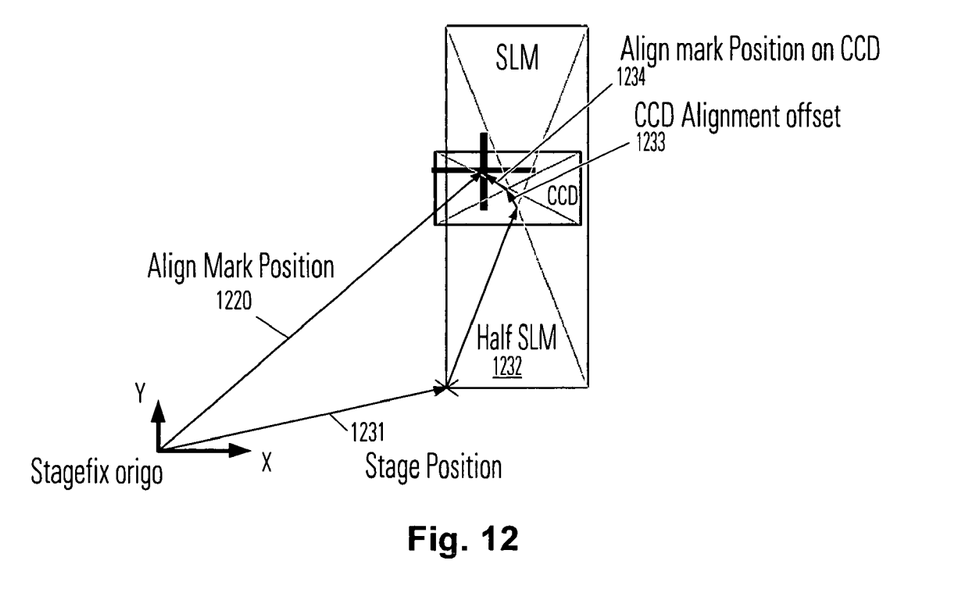
FIG. 12 illustrates a strategy for calculating the first layer alignment mark position, where the calculated position is a sum of vectors.

FIG. 12 illustrates a strategy for calculating the first layer alignment mark position, where the calculated position is a sum of vectors. The position of the alignment mark can be calculated as a sum of position vectors:

Align Mark Position (1220)=Stage Position (1231)+Half the SLM size (1232)+CCD Alignment Offset (1233)+Alignment mark position on the CCD (1234)

Applying this sum of vectors, the stage position error is averaged out by multiple integrated images giving <1 nm 3σ accuracy. The measurement of the CCD alignment offset has <2 nm 3σ accuracy. The alignment mark position on CCD measurement accuracy, explained in FIG. 2 through FIG. 9, is <2 nm 3σ. The system uses up to 16 alignment marks to calculate translation, rotation, orthogonality and scale transformation. This is a very useful accuracy.

Some of the improvements which are useful individually and in combinations to improve the accuracy of position measurements include:

1. The rough estimate of the mark center position when placing the measurement windows. This makes the measurement rotation insensitive, which is needed for high precision since both the CCD Image and the substrate can be rotated.

2. Finding the mark outer edges makes the measurement polarization independent.

3. The curve-fit of the derived edge peaks adapts to the specific resist case.

4. The algorithm makes sure that all the 16 alignment mark measurements are made on exactly the same position in the image by iterating the stage position until it does. This tends to cancel out any effects from distortion in the CCD image.

5. All images are normalized against a reference background image for optimized signal quality in the measurement.

6. The images are integrated from multiple (>500) laser pulses at very low dose to average out any substrate/stage errors in the measurement.

3. Different Resist Thicknesses Result in Varying Image Polarities 3.1. Interference Effects Typically, writing a second layer includes applying a single layer of swing optimized resist, such as FEP 171, to the mask. See, e.g., Product brochure, FUJIFILM Arch CO. Ltd., 15th Arai Bldg. 19-20, Jinguhmae 6-chome, Shibuya-Ku, Tokyo, 150-0001 Japan. For analysis, applying FEP 171 with a normal chrome thickness of 90-100 nm gives a difference of light travel inside and outside the first layer chrome pattern, which results in different interference in one of the cases. Where the chrome is present, the destructive interference will be high and the picture will be dark. Where chrome is absent, the reflected light intensity will be higher. Brighter edges come from the scattered light in the transfer between chrome and glass. The measurement algorithm used is as described above in section 2.2.

Figure 13:
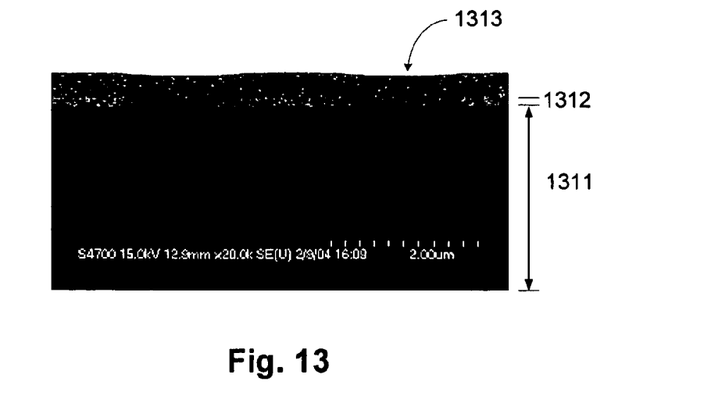
FIG. 13 shows a SEM image taken of a 3 µm line-space grating with approximately 300 nm FEP 171 resist.

3.2. Black Chrome and Quartz Reflectance Showed in Simulations of Varying Resist Thicknesses One question that we addressed as input to the simulations was the resist shaping in the first layer pattern where the chrome was absent. FIG. 13 shows a SEM image taken of a 3 μm line-space grating with approximately 300 nm FEP 171 resist. It clearly shows the resist hanging or sagging 1313 about half the chrome thickness 1312 where the chrome is removed, which was an important input to the reflectance simulations. The substrate 1311 underlies the chrome and resist layers. This SEM picture shows a 3 mm line-space chrome grating coated with 300 nm FEP171 resist. The resist dip 1313 is approximately half the chrome thickness, 50 nm, over the quartz areas.

Figure 15:
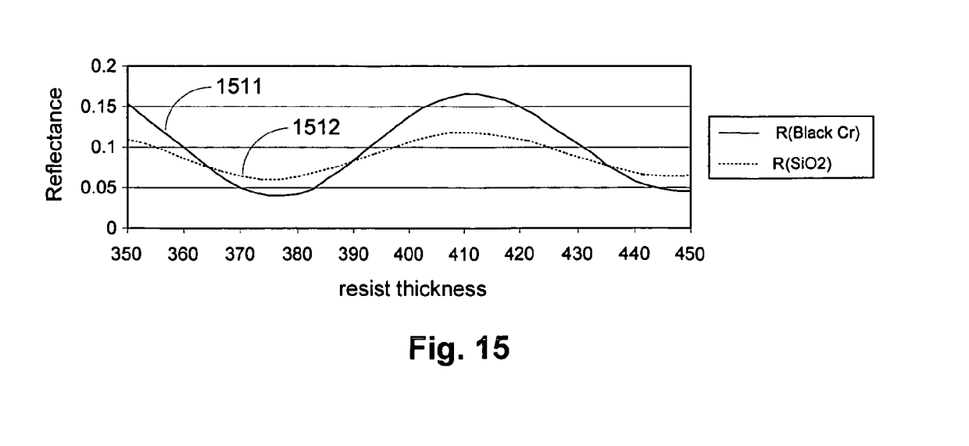

The simulation in FIG. 15 shows the expected reflectance difference between quartz and black chrome at NA 0.82, moving through different resist thicknesses. The vertical axis is reflectance. The horizontal axis is the resist thickness. The reflectance off of black chrome 1511 is a solid line and the reflectance off silicon dioxide 1512 is a dotted line. Since the lowest chrome reflectance corresponds to an optimized swing point, the measurement will have a normal case close to a chrome reflectance minimum and therefore the study is focused around this area of resist thicknesses.

Figure 14:
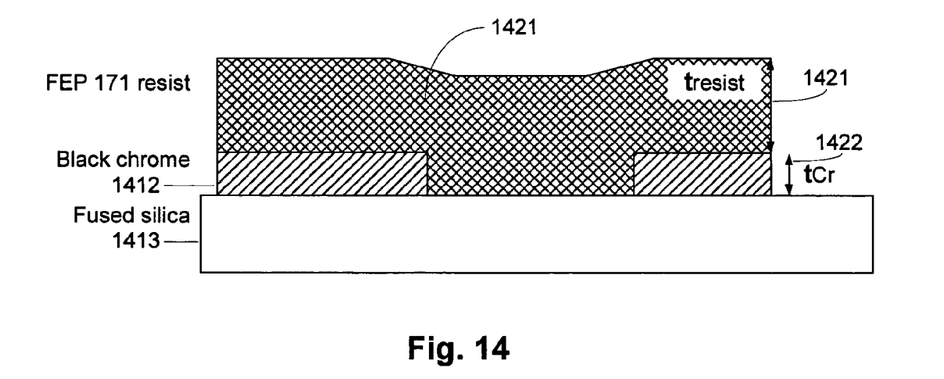

The resist dip estimated from the SEM images is fed back to the simulation. A cross-section corresponding to the simulation setup appears in FIG. 14, which depicts a 50 nm resist dip 1421 over the etched pattern. The resist simulated 1411 is FEP 171 resist. After patterning of the back chrome 1412 in a first process, the resist overlays chrome and a mask blank material 1413, such as fused silica. The chrome has a thickness 1422.

The numerical parameters for the simulations include wavelength 248 nm, resist index n=1.82, substrate index 1.508, chrome layer thickness 100 nm (67 nm Cr+33 nm Cr2O3, refractive index 1.55-i1.53 and 1.88-i0.89 respectively). The calculation was done in ZEMAX optical design program, described at http://www.zemax.com.

As expected for a thin film, the reflectance varies periodically between maximum and minimum. The distance between two adjacent minima (or maxima) is given by:

$$\Delta t = \frac{\lambda}{2n_{resist}}$$

In this case, $\Delta t$=68 nm.

The exact positions of the minima and maxima depend on the refractive index and thickness of the chrome layer. By changing the chrome layer thickness, the two curves are moved relative to each other, since the resist is thicker at the mark. The resulting reflectance relationship between black chrome and quartz, which is displayed in FIG. 15, will be shown later to have a strong correlation to the real measurements.

Machine system tests are time consuming. Therefore, the number of full system tests was limited. When the development of the second layer alignment system was completed, the tests were therefore performed at the process cases, expected to be the most difficult for the system. When the accuracy of the simulations was proven, a preferred resist thicknesses between 360 nm and 400 nm was chosen for real second layer overlay tests.

3.3. Contrast Measurements From Real Second Layer Alignment Tests

Figure 16:
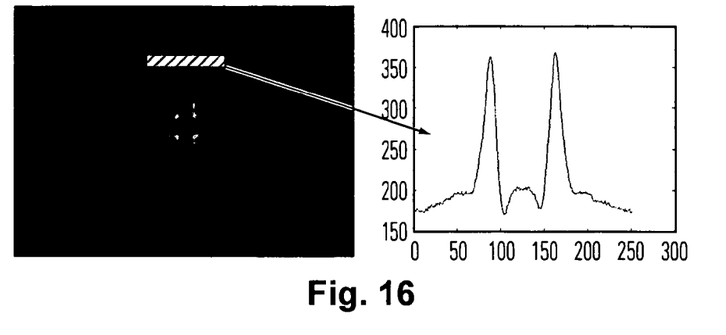
FIG. 16 through FIG. 19 show a series of images at various resist thicknesses and their corresponding intensity distributions.
Figure 17:
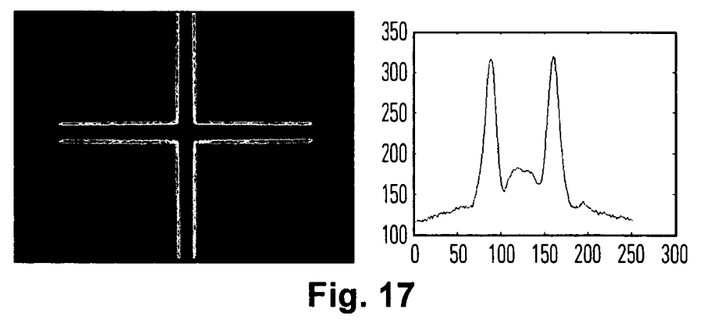
Figure 18:
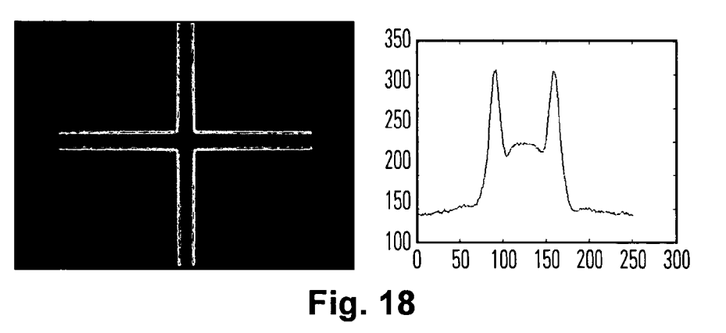
Figure 19:
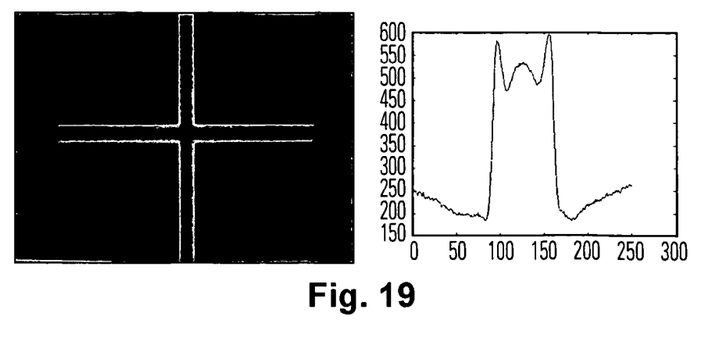

When the Sigma 7300 system was fully developed and functional, the study focused, based on the simulations, especially close to the polarity transition points at the lowest reflectance between 360 and 400 nm resist to see how the real system corresponded in signal quality and measurement precision. A number of second layer overlay performance tests were printed at the chosen resist thicknesses. FIG. 16 through FIG. 19 show a series of images at various resist thicknesses and their corresponding intensity distributions. The order of these figures is increasing contrast. The images have been normalized against a reference background image. The intensity distribution perpendicular to one line of the cross pattern is showed to illustrate the contrast shape. FIG. 16 shows a 390 nm layer of FEP 171 resist. The case that was expected to be the most difficult one, but due to the diffraction effects around the chrome edges, the integrated intensity distribution has perfect quality. FIG. 17 shows a 385 nm layer of FEP 171 resist. The quartz reflectance increases and the signal is still good. FIG. 18 shows a 370 nm layer of FEP 171 resist. The quartz reflectance increases and the signal is still good. FIG. 19 shows a 375 nm layer of FEP 171 resist. The difference between quartz and chrome reflectance is at its peak and the signal is good. Among FIGS. 16-19, the polarity of the figure/background changes without affecting the measurement precision. This is especially interesting because of the diffractive phenomenon that creates skeleton edges in the images.

All of these second layers had overlay results mean+3 sigma<25 nm in x and y and there does not seem to be any correlation between the shift in contrast and the final overlay result.

3.4. Comparison Between Real Measurements and Simulated Results

Figure 20:
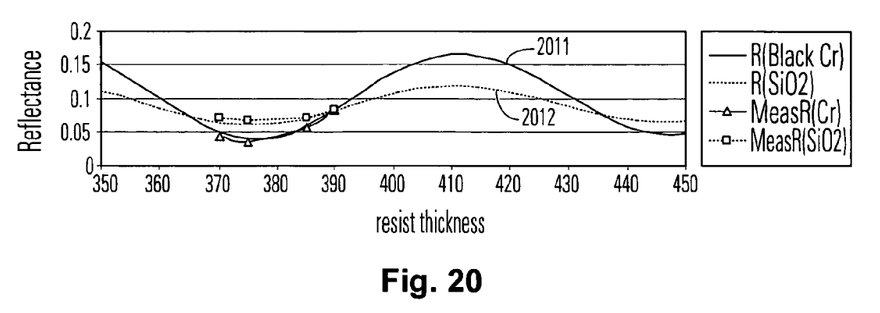

If the measured reflectance levels are compared to the simulated ones, a strong correlation is seen as shown in FIG. 20. As in FIG. 15, the vertical axis is reflectance. The horizontal axis is the resist thickness. The simulated reflectance off of black chrome 2011 is a solid line and the simulated reflectance off silicon dioxide 2012 is a dotted line. Measured values are indicated with triangles and squares, to show correspondence of measurements with simulated reflectance.

Figure 21:
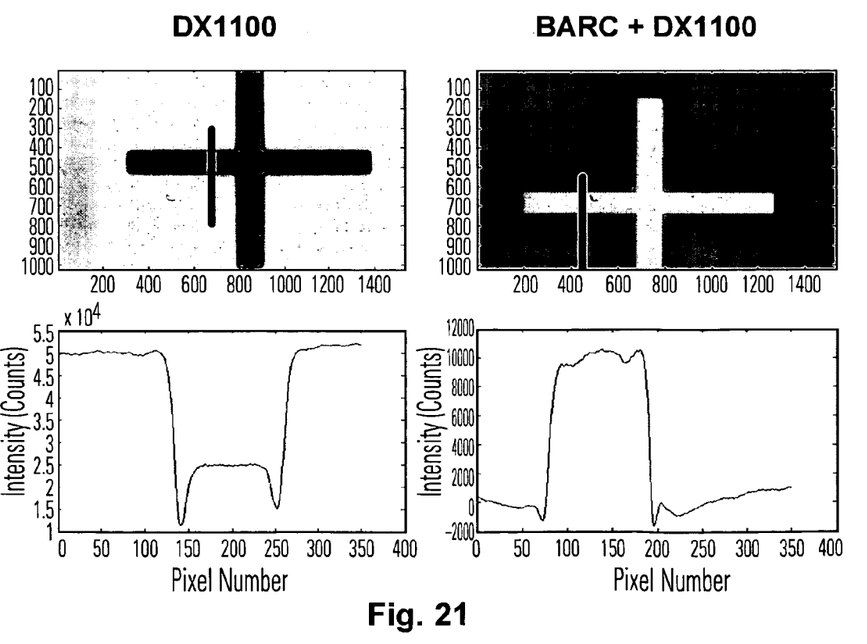
FIG. 21 illustrates results of tests performed using DX1100P resist.

Similar tests were also performed using DX1100P resist, showing the same good performance results, as illustrated in FIG. 21.

4. Absorbing Layer of AR Coating Between the Chrome and Resist

The new chemically amplified resists together with black chrome, are not dependent on AR layer for preventing footing effects. It is expected that BARC and TARC AR layers will rarely be used with the new CAR/black chrome combination, when performing second layer writing.

Even though use of AR layers is considered unlikely, it has been studied to help understand what to expect in second layer alignment performance and image contrast in the reflected CCD images. One study addressed the effects of AR coatings and how to compensate for any difficulties by simulations and real case measurements. While it is expected that AR Coatings for second layer PSM printing will rarely used, if they were, organic BARC would be the most likely AR coating.

The investigation has been done using a layer of KRF17B BARC AR coating, looking especially at how the reflected image contrast would be and also what happens to the image when the measurement surface has already been exposed.

The result was very interesting since it showed that the reflected image polarity changed immediately after being exposed even with a few low dose DUV laser pulses. It was seen that it was possible to have a situation where the signal quality was poor but by pre exposing the image, the contrast of the first layer alignment mark image improved and was measurable with good position resolution.

Figure 22:
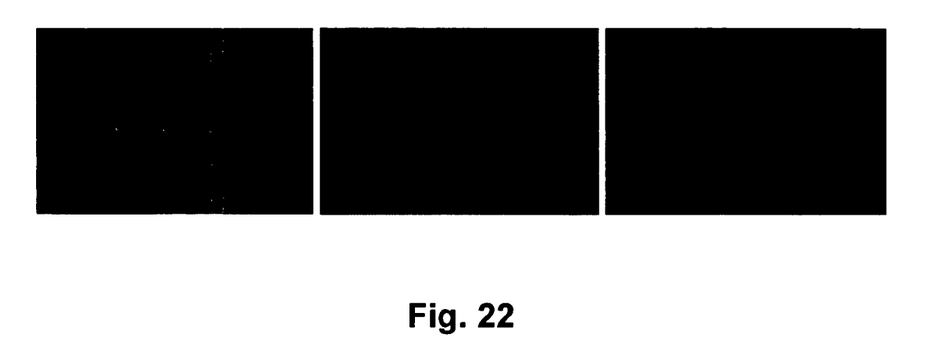
FIG. 22 shows a series of images taken on the same position on the substrate when measuring the position of the first layer alignment cross mark.

FIG. 22 shows a series of images taken on the same position on the substrate when measuring the position of the first layer alignment cross mark. Compared to the images shown in section 3.3, these images have not been normalized against a reference background image, which makes them look a little fuzzy. The FIG. 22 images show the bleaching effect of the BARC. This effect can be used to prevent bad contrast situations by implementing a pre-expose function. The images clearly show that even if the AR layer seems efficient during the first exposure, the refractive index changes and it looses the AR effect as a function of the exposed amount of 248 nm DUV light. The signal quality of the first and the last images of FIG. 22 is good, although the polarity is changed, but the second image has poor contrast. Since the second one shows poor signal quality, it is reasonable to believe that this also could be the first image and then destroying the precision in the second layer alignment measurement. A further was made, simulating bleaching effects to evaluate whether the images in FIG. 22 were logical and made sense.

Figure 23:
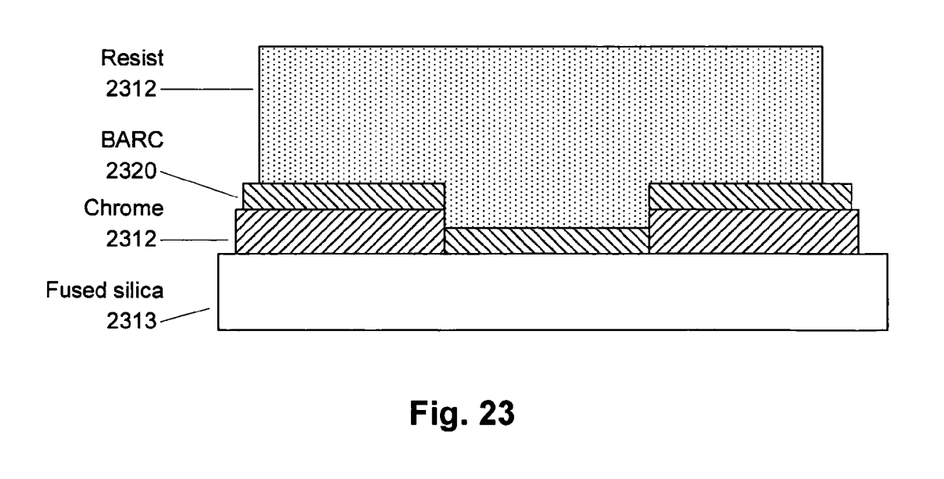
FIG. 23 illustrates how the BARC simulation setup differs from the prior simulation setup.

The further study used a BARC layer coated on top of the black chrome. FIG. 23 illustrates how the BARC simulation setup differs from the prior simulation setup in FIG. 14. The eventual resist dip is not considered, since the purpose of the simulation only focuses on studying the bleaching effect. The layers in the figure include a substrate 2313 such as fused silica, overlaid by chrome 2312, then BARC 2320 and resist 2311. Areas where the chrome has been patterned, the BARC directly overlays the substrate. BARCs are organic thin films, which have some absorption for the exposure wavelength. The optical properties of BARCs are rarely published, but to be able to make some simulations, we use data for 4 types obtained from http://www.e-insite.net/semiconductor/index.asp?layout=article& articleid=CA47478. The optical constants (for 248 nm) are given in the table. The reflectance properties for these BARC types are presented in FIG. 24.

Optical constants for four different BARCs were:

| BARC type | N | k |
|---|---|---|
| BARC A | 1.74 | 0.33 |
| BARC B | 1.59 | 0.55 |
| BARC C | 1.48 | 0.41 |
| BARC D | 2.27 | 0.54 |

Figure 24:
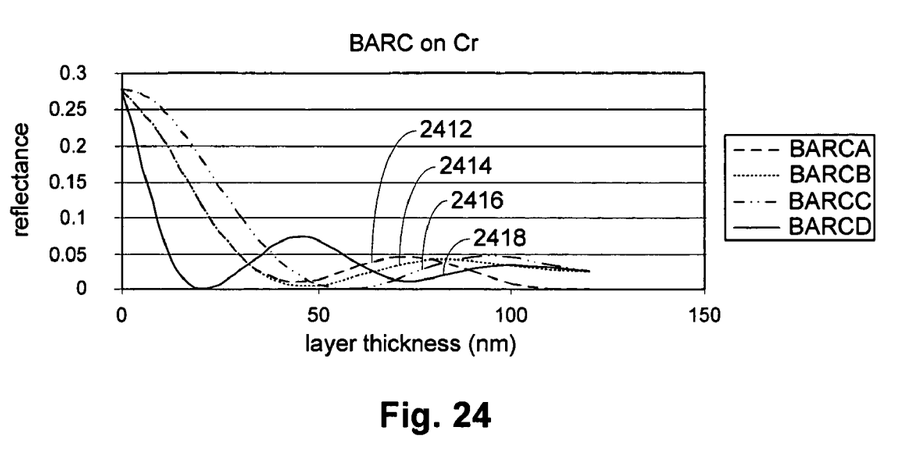
FIG. 24 presents simulated results using different BARC types.

FIG. 24 presents simulated results using different BARC types. These results show similar optimal reflectance levels but at different layer thicknesses for the four BARC types in the table above. During the measurements for determining the position of the alignment mark, the resist-coated substrate is exposed to DUV radiation. One might expect that this exposure can cause both the resist and the BARC layer to bleach, i.e. the optical properties change. The main effect will probably be a change in the absorption, i.e. in the imaginary part (k) of the complex refractive index. This will lead to a dramatic change in the properties of the BARC, as the following simulation shows.

Figure 25:
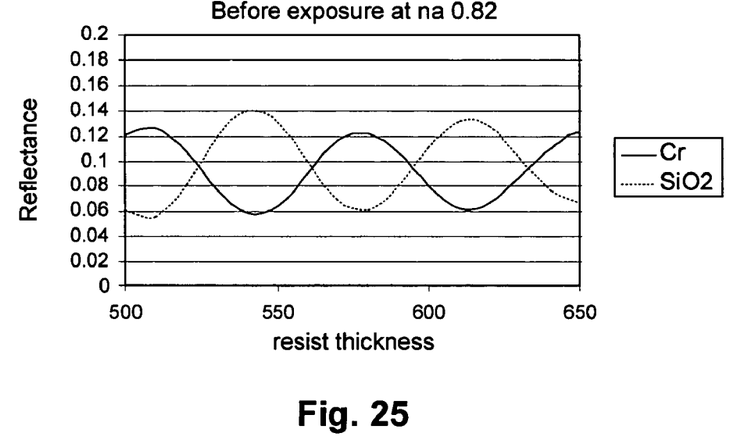
FIG. 25 repeats the calculations simulated in FIG. 24, simulating bleaching by setting set k=0 for the BARC.
Figure 26:
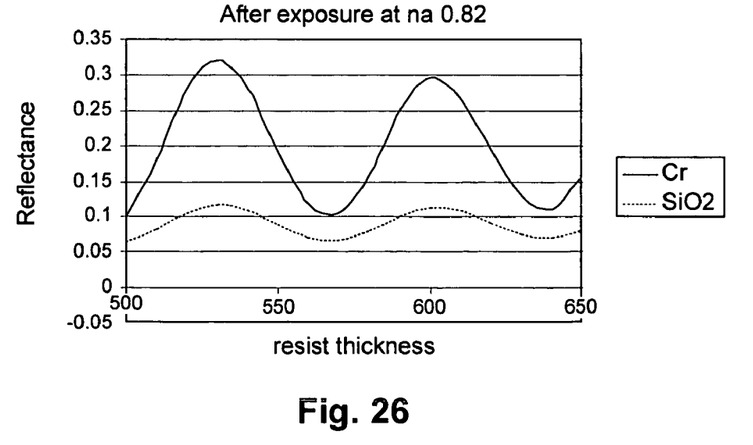
FIG. 26 shows the reflectance of chrome and quartz after DUV exposure.

We repeated the calculations simulated in FIG. 24, but to simulate bleaching, we have set k=0 for the BARC. As FIG. 25 shows, the chrome reflectance has radically changed and is now similar to the case without BARC, only the minima has shifted slightly due to the phase shift introduced by the BARC layer. FIG. 25 shows the reflectance of chrome and quartz as a function of resist thickness before the BARC has been exposed to DUV. FIG. 26 shows the reflectance of chrome and quartz after DUV exposure. The simulations predict the same effect observed in the images of FIG. 22.

Since the different organic BARC types are expected to show the same result and that the AR efficiency of the BARC is reduced after exposure, the resulting action has been to implement the pre-expose function where a tunable number of low dose laser pulses are exposed before the real measurement exposure is executed. The tests performed also showed that the BARC bleaching pre-exposure function does not introduce any measurement errors.

5. Conclusions

Position measurement strategy: The algorithm for calculating an exact position in the image is explained to show how an edge detection algorithm is applied for this purpose. The results show the measurement precision for each alignment mark is very high.

Different resist thicknesses results in varying image polarities: Simulations were made in ZEMAX to predict how the polarity of the images would change due to resist thickness variation. This was verified in the real case showing excellent correlation and also showed that the measurement strategy handled the different cases without any decrease in measurement precision. Since these tests have been performed at the most difficult cases of resist thickness, it is shown that the disclosed layer alignment system works throughout the relevant range of resist thicknesses. Since similar tests have been performed on other chemically amplified resists than FEP 171 with similar performance, which indicates that the resist thickness insensitivity is valid for all resists.

Absorbing layer of AR coating between the chrome and resist: The study of absorbing AR layer showed that the process case tested, which was a layer of KRF17B BARC, lost its AR efficiency after being exposed with a few low dose pulses of 248 nm light. It showed that there is a possibility of a bad signal quality on the first measurement but by using a tunable pre-exposure function the contrast can be increased to a good signal quality. The pre-exposure functionality is a safety precaution against a poor first image.

5.1. An Alignment Tool—Roughalign

When measuring a written plate in a writer you always face the time consuming task of finding the first part of the pattern, e.g. the first part of the alignment mark V-mark. This problem is due to a poor loading accuracy, manual or automatic, and the relative small size of the patterns to be found.

The basic idea is to make a pattern big enough not to be lost, even though the loading accuracy is in the range of millimeters. This pattern is designed to contain information of x- and y-position in the whole pattern area. When docking anywhere in this pattern you can make a single measurement telling exactly where you are in the pattern. By adding a movement with an additional measurement the rotation of the pattern can be extracted. Having this information it is possible to position anywhere in the pattern to be analyzed. This of course requires that the relative position between the two patterns is known.

5.2. The Pattern

One embodiment of the pattern consists of an array of V-marks. The V-marks are long (4-8 mm) with a width of 70 microns. The width of the first bar of the V-mark is 10 microns and the second (tilted) is 15 microns wide, measured in the y-direction.

The initial pitch between the first marks is 80 microns. This pitch increases linearly in steps of 1 micron giving 80, 81, 82 . . . . The number of the V-marks is adjusted to make the pattern square. For a 4 by 4 mm pattern this gives 40 marks and for a 8 by 8 pattern this number goes up to 70.

The V-mark array is in dark field on a clear field square.

5.3. Analysis of the Pattern

After docking in the pattern 11 flanks are measured. These flanks include the two bars of two consecutive V-marks. Since the two bars have a different width they can easily be identified. After this identification the pitch between the V-marks as well as the pitch of the V-marks themselves are calculated. For the further calculations the coordinates of the present position (x0,y0) are stored.

Since these measurements are affected by a possible rotation the rotation of the pattern (j) has to be measured. This rotation can be estimated by making a second measurement on another x-coordinate. In order to make a safe movement it must first be decided in which direction to move not to end up outside the pattern. By analyzing the measured pitch of the V-marks it can be concluded if the head is docked above or below the center of the pattern. Knowing this it is safe to move in the direction towards central regions of the pattern.

If the rotation of the plate is large there is a risk of loosing track of the pattern when moving in x. To avoid this a small initial movement (50 microns) gives a rough estimation of the rotation. With this estimation it is now safe to move 2 mm, giving a higher angular resolution.

With the rotation known the measured pitches are adjusted to a few trigonometric relations. The pitch of the two V-mark give the x-offset to the "origin" of the pattern (Dx). The pitch between the marks identifies their numbers in the array (index). This index in turn gives the y-offset to the pattern "origin" (Dy).

The calculated offsets are only valid in the coordinate system of the pattern. By including the pattern rotation the pattern origin can be transformed into the coordinate system of the stage (x_origin, $y_{13}$ origin).

A position accuracy of 10-20 microns was achieved with rotations up to at least five degrees. The goal pattern was in these tests placed roughly 3 cm from the roughalign pattern

5.4. Further Thoughts

In order to make the roughalign pattern general, all machines (all levels) should be able to both write and measure the pattern. There could of course be level specific versions but I think the aim should be to avoid this. The patterns designed so far (roughalign 4×4 and roughalign 8×8) ought to fulfill these generality requirements. They always leave at least two V-marks in the short sweep of the level 60 and the 10 microns width of the first V-mark bar should be resolved by the lover levels.

Different applications require different sizes of the pattern. When loading a GP with the loader the accuracy is generally good enough to use a 4 by 4 mm pattern. When loading a monitor plate by hand the larger 8 by 8 mm could be useful. By having two different ratios of the width of the V-mark bars these two patterns versions could be automatically identified and treated separately.

VARIOUS EMBODIMENTS

This discussion of PSM alignment and the accompanying appendix are complementary documents. This description is a further refinement of information developed for the appendix. The existing hardware depicted in the appendix, for instance, can be used with the methods and procedures described herein. The methods and procedures described herein are expected to produce results having similar or better accuracy than described in appendix.

One aspect of the present invention is that the same illumination source may be used for alignment and for printing of patterns. For alignment, the source may be projected onto the workpiece using the SLM or, alternatively, using an additional mirror. When the SLM is used for projecting illumination during alignment, the amount of illumination can be controlled by appropriate orientation of the mayor's, as has been described in previous applications assigned to Micronic Laser.

One embodiment of present invention is a method for writing a second layer of a pattern aligned to a first layer of the pattern on a workpiece using a spatial light modulator (SLM). This method includes loading the workpiece which includes the first layer of pattern, at least one pre-alignment mark, and at least one alignment mark, onto a stage in the pattern generator. The method further includes aligning the SLM with a CCD camera, detecting at least one pre-alignment mark using the CCD camera, detecting at least one alignment mark using the CCD camera and writing a second layer of pattern on the workpiece using information about the detected at least one alignment mark.

In the method described, a variety of marks may be used. One suitable pre-alignment mark includes horizontal and vertical gridlines, where the horizontal and vertical gridlines have an increasing pitch or decreasing spatial frequency. The change in pitch or frequency may be linear, exponential or logarithmic.

Another aspect of the method involves controlling for the background appearance against which a reference mark or alignment mark appears. According to this aspect, an image is captured from a reference area of the workpiece using the CCD camera and information from the reference image is used to correct an image collected during detecting the at least one alignment mark using the CCD camera. This information may be used by subtracting the reference image from the image collected. Alternatively, it could be is to calibrate the smoothing process.

In addition to the fitting and smoothing process is described above, wavelet transforms such as "db" wavelets or Mexican hat wavelets could be used to separate and signal from scattered light or noise. The MATLAB Wavelet Toolbox User's Guide, Version 2, by Michel Misitis, Yves Mitsit, Georges Oppenheim and Jean-Micel Poggi, which is presently available at http://www.mathworks.com/access/helpdesk/help/pdf_doc/wavelet/wavelet_ug.pdf provides an enabling description of may wavelet applications, including detection of discontinuities, and is hereby incorporated by reference.

Another aspect of the present invention involves relaying an alignment image from the SLM onto a section the workpiece, detecting the projected alignment image with the CCD camera and aligning the CCD camera using information about the detected at projected alignment image.

Any the aspects described above may be combined with pre-exposing the resist covering the at least one alignment mark before detecting alignment mark using the CCD camera. Pre-exposing the resist changes its optical characteristics.

Any of the embodiments or aspects above may be combined with calculating at least translation and alignment parameters of alignment.

Another embodiment of present invention is an alignment mark for use in lithography as described above. This mark includes horizontal and vertical gridlines, where the horizontal and vertical gridlines have an increasing pitch or decreasing spatial frequency. The changing pitch or frequency may be linear, exponential or logarithmic.

A further embodiment is method of aligning a spatial light modulator (SLM) to write a second layer of a pattern over a first layer of a pattern on a workpiece, wherein the workpiece includes at least one coarse alignment mark and the workpiece is supported by a stage that includes at least one reference mark. This embodiment includes illuminating the coarse alignment mark with radiation relayed from the SLM and detecting the coarse alignment mark using a camera. It further includes detecting the reference mark; and calculating the alignment of the workpiece and the SLM using at least information from detecting the reference mark and the coarse alignment mark. The steps of this embodiment can be applied, in combination or in the alternative, to a coarse alignment mark and/or a fine alignment mark. In general, any of the aspects of embodiments mentioned above also can be applied to or combined with this embodiment.

Yet another embodiment is method of producing a phase shifted mask or reticle, according to the any of the prior embodiments and further including exposing a layer of radiation sensitive material on the workpiece after a first patterning of the workpiece. This method also includes patterning phase shifting structures on the workpiece using the exposed layer. Again, any of the aspects of embodiments mentioned above also can be applied to or combined with this embodiment.

Another embodiment is a method of producing precise structures on a second workpiece according to the preceding embodiment, wherein the workpiece of is a mask or reticle. This method further includes exposing a layer of radiation sensitive material on the second workpiece using the mask or reticle and patterning a layer of a device structure on the second workpiece using the exposed layer on the second workpiece. Yet again, any of the aspects of embodiments mentioned above also can be applied to or combined with this embodiment.

Additional aspects the present invention are described in the claims to follow.

Of course, the present invention can alternatively be practiced as a device including logic and resources adapted to carry out the methods described above. The device may be a pattern generator, a module installed the pattern generator, or an external device in communication with the pattern generator. Or, it may be practiced is an article of manufacture impressed with machine-readable code adapted to carry out the methods described above.

REFERENCES

1. R. Plontke, L. Bettin, D. Beyer, J. Butschke, M. Irmscher, C. Koepernik, B. Leibold, A. Vix, P. Voehringer, "Avoidance/Reduction of Charging Effects in Case of Partially Insufficient Substrate Conductivity when using ESPACER 300Z", 20th European Mask Conference on Mask Technology for Integrated Circuits and Micro-Components, GMM-FB 43, pp 233-240, 2004.

2. H. Martinsson, J. Hellgren, N. Eriksson, M. Bjuggren, T. Sandström, "Transparent corner enhancement scheme for a DUV pattern generator", Photomask Japan 2003, Proceedings SPIE vol. 5130, pp 297-308, 2003.

3. T. Sandström, P. Askebjer, J. Sellander, R. Zerne, A. Karawajczyk, "Pattern Generation with SLM Imaging", 21st Annual BACUS Symposium on Photomask Technology, Proceedings SPIE vol.4562, pp 38-44, 2001.

4. ZEMAX Development Corp. http://www.zemax.com 5. http://www.e-insite.net/semiconductor/index.asp?layout=article&articleid=CA47478

6. Product brochure, FUJIFILM Arch CO. Ltd., !5th Arai Bldg. 19-20, Jinguhmae 6-chome, Shibuya-Ku, Tokyo, 150-0001 Japan.

All of the references cited herein are incorporated by reference in their entirety.

We claim as follows:

1. A method of aligning a spatial light modulator (SLM) to write a second layer of a pattern over a first layer of a pattern on a workpiece, wherein the workpiece includes at least one coarse alignment mark and the workpiece is supported by a stage that includes at least one reference mark, the method including:
   illuminating the coarse alignment mark with radiation relayed from the SLM;
   detecting the coarse alignment mark using a camera;
   detecting the reference mark; and
   calculating the alignment of the workpiece and the SLM using at least information from detecting the reference mark and the coarse alignment mark.

2. The method according to claim 1, wherein calculating the alignment includes calculating at least translation and rotation parameters.

3. The method according to claim 1, wherein detecting the at least one coarse alignment mark includes detecting a plurality of the coarse alignment marks.

4. The method according to claim 1, wherein the detecting the coarse alignment mark further includes fitting a wavelet to an intensity distribution of the coarse alignment mark.

5. The method according to claim 1, wherein the workpiece further includes at least one fine alignment mark, the method further including:
   illuminating the fine alignment mark with radiation relayed from the SLM; and
   detecting the fine alignment mark using the camera;
   wherein calculating the alignment of the workpiece and the SLM further includes using information from detecting the fine alignment mark.

6. The method according to claim 5, wherein calculating the alignment includes calculating at least translation and rotation parameters of the alignment.

7. The method according to claim 5, wherein detecting the at least one fine alignment mark includes detecting a plurality of the fine alignment marks.

8. The method according to claim 5, wherein the detecting the fine alignment mark further includes fitting a wavelet to an intensity distribution of the coarse alignment mark.

9. The method according to claim 1, further including aligning the SLM with the camera.

10. The method according to claim 1, wherein the camera is a CCD camera.

11. The method according to claim 1, where the at least one coarse alignment mark includes a horizontal and a vertical grid superimposed, where the horizontal and vertical grid have increasing pitches.

12. The method according to claim 11, wherein the pitch is linearly increasing in at least one of the horizontal and vertical directions.

13. The method according to claim 11, wherein the pitch is exponentially increasing in at least one of the horizontal or vertical directions.

14. The method according to claim 11, wherein the pitch is logarithmically increasing in at least one of the horizontal or vertical directions.

15. The method according to claim 11, wherein the pitch increases from the center towards the edges of the coarse alignment mark.

16. The method according to claim 11, wherein the pitch increases from the edges towards the center of the coarse alignment mark.

17. The method according to claim 1, further including:
capturing an image of a reference area of the workpiece by the camera,
subtracting the image of the reference area from an image of the at least one coarse alignment mark on the workpiece when determining a position of the at least one coarse alignment mark on the workpiece.

18. The method according to claim 5, further including:
capturing an image of a reference area of the workpiece by the camera,
subtracting the image of the reference area from an image of the at least one fine alignment mark on the workpiece when determining a position of the at least one fine alignment mark on the workpiece.

19. The method according to claim 1, further including:
relaying an alignment image from the SLM onto a section of the workpiece, detecting the projected alignment image with the CCD camera and aligning the CCD camera by using information of the detected projected alignment image.

20. The method according to claim 1, further including:
pre exposing a resist covering the at least one alignment mark before detecting the alignment mark using the camera.

21. The method according to claim 9, wherein the SLM projects an alignment mark onto the workpiece that is detected by the camera.

22. The method according to claim 21, wherein the camera is a CCD and the projected alignment mark is detected in the same region of the CCD as the coarse alignment marks.

23. The method according to claim 21, wherein the workpiece further includes at least one fine alignment mark, the method further including:
illuminating the fine alignment mark with radiation relayed from the SLM; and
detecting the fine alignment mark using the camera;
wherein calculating the alignment of the workpiece and the SLM further includes using information from detecting the fine alignment mark; and
wherein the camera is a CCD and the projected alignment mark is detected in the same region of the CCD as the fine alignment marks.

24. The method according to claim 1, wherein an intensity distribution of a detected image of the at least one alignment mark on the workpiece is derived.

25. The method according to claim 24, wherein a first derivative of the intensity distribution of the detected image is derived and detecting the coarse alignment mark uses the first derivative.

26. A method of producing a phase shifted mask or reticle, according to claim 1, further including
exposing a layer of radiation sensitive material on the workpiece after a first patterning of the workpiece; and
patterning phase shifting structures on the workpiece using the exposed layer.

27. A method of producing precise structures on a second workpiece according to claim 26, wherein the workpiece of claim 26 is a mask or reticle, further including:
exposing a layer of radiation sensitive material on the second workpiece using the mask or reticle; and
patterning a layer of a device structure on the second workpiece using the exposed layer on the second workpiece.

28. An alignment mark for use in lithography including a horizontal and a vertical grid superimposed, where the horizontal and vertical grids have increasing pitches.

* * * * *